United States Patent
Shin et al.

(10) Patent No.: US 10,201,811 B2
(45) Date of Patent: Feb. 12, 2019

(54) METHOD FOR MANUFACTURING MODULAR MICROFLUIDIC PAPER CHIPS USING INKJET PRINTING

(71) Applicant: INDUSTRY-UNIVERSITY COOPERATION FOUNDATION SOGANG UNIVERSITY, Seoul (KR)

(72) Inventors: Kwan Woo Shin, Seoul (KR); Hyo Jin Ko, Seoul (KR); Oh-Sun Kwon, Seoul (KR); Jae Hak Choi, Daejeon (KR); Byeong No Lee, Seoul (KR); Ju Mi Lee, Seoul (KR)

(73) Assignee: Industry-University Cooperation Foundation Sogang University, Seoul (KR)

( * ) Notice: Subject to any disclaimer, the term of this patent is extended or adjusted under 35 U.S.C. 154(b) by 1008 days.

(21) Appl. No.: 14/398,455

(22) PCT Filed: May 2, 2013

(86) PCT No.: PCT/KR2013/003815
§ 371 (c)(1),
(2) Date: Nov. 1, 2014

(87) PCT Pub. No.: WO2013/165194
PCT Pub. Date: Nov. 7, 2013

(65) Prior Publication Data
US 2015/0110689 A1    Apr. 23, 2015

(30) Foreign Application Priority Data

May 2, 2013    (WO) ................ PCT/KR2013/003815

(51) Int. Cl.
*B01L 3/00*    (2006.01)
*B81C 1/00*    (2006.01)
*B81B 7/00*    (2006.01)

(52) U.S. Cl.
CPC .... *B01L 3/502707* (2013.01); *B81C 1/00373* (2013.01); *B01L 2300/0645* (2013.01);
(Continued)

(58) Field of Classification Search
CPC ..... B01L 2300/0645; B01L 2300/0887; B01L 2300/126; B01L 2400/0406;
(Continued)

(56) References Cited

U.S. PATENT DOCUMENTS

2007/0000776 A1* 1/2007 Karube ............. G01N 27/3272
204/403.01
2008/0257438 A1* 10/2008 Wang ........................ F15C 5/00
137/833
(Continued)

FOREIGN PATENT DOCUMENTS

JP    2011253546 A    12/2011
KR    10-0523765 B1    10/2005
(Continued)

OTHER PUBLICATIONS

International Search Report for PCT/KR2013/003815.

*Primary Examiner* — Jennifer Wecker
(74) *Attorney, Agent, or Firm* — Harness, Dickey & Pierce, P.L.C.

(57) ABSTRACT

The present invention relates to a method for manufacturing a module type microfluidic chip comprising: (a) printing electrode patterns on a substrate using a conductive ink and inkjet printing; (b) cutting the printed electrode patterns; and (c) assembling the cut electrode patterns to manufacture the module type microfluidic paper chip. Unlike the traditional method for manufacturing printed circuit substrate using a patterning agent or device, the method of the present invention only incorporates a simple printing process using an inkjet printer, and thus patterning can be simplified and
(Continued)

various types of chips can be manufactured depending on the assembly type of electrode patterns. Accordingly, inexpensive, economical, and highly utilizable microfluidic chips can be provided using the method of the present invention.

11 Claims, 13 Drawing Sheets

(52) U.S. Cl.
CPC . *B01L 2300/0887* (2013.01); *B01L 2300/126* (2013.01); *B01L 2400/0406* (2013.01); *B01L 2400/0427* (2013.01); *B81B 2201/058* (2013.01); *B81B 2203/04* (2013.01); *B81C 2201/0184* (2013.01); *Y10T 29/49117* (2015.01)

(58) Field of Classification Search
CPC ....... B01L 2400/0427; B01L 3/502707; B81B 2201/058; B81B 2203/04; B81C 1/00373; B81C 2201/0184; Y10T 29/49117
See application file for complete search history.

(56) References Cited

U.S. PATENT DOCUMENTS

| | | |
|---|---|---|
| 2009/0065767 A1 | 3/2009 | Reynolds et al. |
| 2009/0181864 A1* | 7/2009 | Nguyen ............ B01L 3/502792 506/33 |
| 2011/0111517 A1* | 5/2011 | Siegel ............... B01L 3/502707 436/164 |
| 2012/0044299 A1* | 2/2012 | Winger .................. B41J 2/1606 347/54 |
| 2012/0181184 A1* | 7/2012 | Whitesides ............. B01L 3/502 205/775 |
| 2016/0033438 A1* | 2/2016 | Lan ...................... G01N 27/301 205/781 |

FOREIGN PATENT DOCUMENTS

| | | |
|---|---|---|
| KR | 10-0602811 B1 | 7/2006 |
| KR | 10-0801670 B1 | 2/2008 |
| KR | 10-2011-0060028 A | 6/2011 |

* cited by examiner

| Step | Operation |
|---|---|
| 1 | |
| 2 | |
| 3 | |
| 4 | |
| 5 | |

FIG. 10

METHOD FOR MANUFACTURING MODULAR MICROFLUIDIC PAPER CHIPS USING INKJET PRINTING

BACKGROUND

Field of the Invention

The present invention relates to method for manufacturing module-type microfluidic paper chip using inkjet printing.

Background Art

Existing digital microfluidic chips are manufactured by performing complicated procedures, such as photolithography and etching, on a glass or silicon substrate (R. B. Fair, Microfluid Nanofluid, 3:245-281(2007)), and apparatuses and chemicals used herein are expensive and very harmful to the human body and environment. Most digital microfluidic chips are in closed systems (Robert J. Linhardt et al., J. AM. CHEM. SOC., 131:11041-11048(2009)), and have a disadvantage in that a cover plate needs to be removed in order to analyze products after several reactions on the chip. With respect to an open chip system (Abdelgawad, Park, and Wheeler J. Appl. Phys., 105:094506 (2009)), the existing methods are also employed in the forming process of electrode patterns during the manufacturing procedure thereof, and thus the above-described problems occur.

Through electrowetting, the movement of fluid can be controlled by electricity, and the electrowetting is employed in the digital microfluidic chips. In easy terms, the electrowetting phenomenon refers to the change of surface tension by electricity. This phenomenon was first discovered by Gabriel Lippmann (1845~1921) in 1875. When acid water contained in the capillary tube, the concaved meniscus appears such that the height of center of water column is lower than the contact line between water and the inner wall of tube. The contact line which is slightly raised along the wall of tube is formed as a result of balance among the interfacial tensions of three phases, i.e., air, water and rigid wall, being in equilibrium state. When the electric potential applied water and the metallic tube the height water raised with the shape of meniscus changed with being less concaved, in other word the contact angle reduced as much as the applied capillary tension induced by electric potential.

Lippmann called it 'electrocapillarity', but no new light was shed on this technique for 100 years after that. Electrocapillarity occurred at a low voltage of only 1 V or smaller, and a voltage higher than 1 V decomposed water into oxygen and hydrogen. After that, electrowetting in which the surface tension can be controlled by a high voltage was discovered in 1990, just by introducing a thin insulating film between the acid water and the electrode. According to Bruno Berge, a metal plate was covered with a thin insulator, and then a drop of water was dropped thereon. When electricity was applied between the metal plate and the water droplet, the higher the voltage, the thinner the water drop spread. Through this manner, it was impossible to change the shape of a water drop even at a high voltage of several tens of V.

A carbon nanotube is a new material, in which hexagon shapes made of six carbon atoms are connected together in a tubular form, and which was discovered by Sumio Iijima at Research Institute of Nippon Electronic Company (NEC) in 1991 while analyzing a carbon mass that was formed on the cathode of graphite using the electric discharge method. As for the carbon nanotube, hexagon shapes made of six carbon atoms are connected together in a tubular form. The diameter of the tube is merely several to several tens of nanometers, and thus called as the carbon nanotube. One nanometer is $1/1,000,000,000$ (one one-billion) meter, and $1/100,000$ of one hair. The carbon nano tube has a similar electric conductivity to copper, the same thermal conductance diamond which is the most excellent in the natural system, and is 100 times stronger than the stainless steel. While the carbon fiber is broken by a variation of only 1%, the carbon nanotube can withstand a variation of even 15%. Since the carbon nanotubes were discovered, scientists have devoted themselves to searching a synthesis and application thereof, and thus have developed a lot of devices, such as a semiconductor, a flat display, a battery, an ultra-high strength fiber, a biosensor, and a TV monitor, using the carbon nanotubes.

Korean Patent Registration No. 10-0523765 provides a method for manufacturing a carbon nanotube array using supramolecular nano patterns. More specifically, disclosed is a method for manufacturing a carbon nanotube (CNT) array, the method comprising: forming an organic supramolecular thin film on a substrate; inducing a self-assembly of organic molecules through heat treatment; applying UV to the thus formed predetermined organic supramolecular structure to form a hole-shaped nano pattern; and arranging carbon nanotubes in the nano pattern. According to the above patent, in the manufacturing procedure of the CNT chip, the patterning is performed in a manner in which the self-assembly of organic supramolecules and the UV etching are used to form the pattern, and the CNTs are allowed to bind to the pattern or be arranged in the pattern. Therefore, the above patent has disadvantages in that the patterning process is complicated and the UV etching needs to be conducted, when compared with the present invention.

Korean Patent Application Publication No. 10-2011-0060028 provides a carbon nanotube-polymer complex and a method for directly patterning carbon nanotubes on a substrate in a particular direction using the same. More specifically, provided are a carbon nanotube-polymer complex and a method for directly patterning carbon nanotubes on a substrate in a particular direction using the same, in order to form patterns having orientation in a particular direction on a substrate including a carbon nanotube dispersion solution, a surfactant, and a polymer solution with viscosity. According to the above patent, for the adsorption of the carbon nanotube, the patterning is performed on the substrate by conducting treatment with a mixture solution of sulfuric acid/peroxide or UV/ozone treatment, and then removing a polymer portion from the carbon nanotube-polymer complex through separate chemical treatment. Therefore, the above patent has disadvantages in that the patterning process is complicated and the additional chemical process is needed, when compared with the patterning method of the present invention.

Due to the problems of the existing drop-based digital microfluidic chips, the development of digital microfluidic chip technology, based on a new mechanism of an open chip that can attain economical feasibility, simplify a complicated manufacturing process, and be applied to processes, such as several kinds of synthesis, is urgently needed. The present invention relates to an economical modular microfluidic chip manufactured by printing various shapes of patterns using a carbon nanotube ink, as a conductive ink, and employing inkjet printing and then cutting and assembling the patterns, and thus provides a modular type microfluidic chip with economical feasibility and high utilizability to solve the advantages.

Throughout the entire specification, many papers and patent documents are referenced and their citations are represented. The disclosures of cited papers and patent documents are entirely incorporated by reference into the present specification, and the level of the technical field within which the present invention falls and details of the present invention are explained more clearly.

SUMMARY

The present inventors have endeavored to develop an inexpensive, economical, and practical microfluidic chip that can be manufactured by a simple method. As a result, the present inventors have developed a module type microfluidic paper chip manufactured by printing various shapes of electrode patterns using a CNT ink and inkjet printing, and then cutting and assembling the electrode patterns. The microfluidic paper chip of the present invention is an assembly type paper chip in which various shapes of electrode patterns are printed on a single sheet of paper, and unnecessary patterns are cut, and the uncut patterns are connected. The microfluidic paper chip of the present invention requires merely a convenient printing procedure using an inkjet printer, unlike the conventional printed circuit board manufacturing method using a patterning agent or a patterning apparatus. Thus, the patterning method can be significantly simplified, and various kinds of chips can be manufactured depending on the assembly type of the electrode patterns, thereby obtaining excellent economic feasibility and utilizability.

An aspect of the present invention is to provide a method for manufacturing module-type microfluidic chip.

Another aspect of the present invention is to provide a module-type microfluidic chip.

Other purposes and advantages of the present invention will become clarified by the following detailed description of invention, claims, and drawings.

In accordance with an aspect of the present invention, there is provided a method for manufacturing module-type microfluidic chip, the method including:

(a) printing electrode patterns on a substrate using a conductive ink and inkjet printing;

(b) cutting the printed electrode patterns; and (c) assembling the cut electrode patterns to manufacture the module type microfluidic paper chip.

BRIEF DESCRIPTION OF THE DRAWINGS

FIG. 10 shows a process of gold nanoparticles synthesis.

DETAILED DESCRIPTION

Figure 1A:
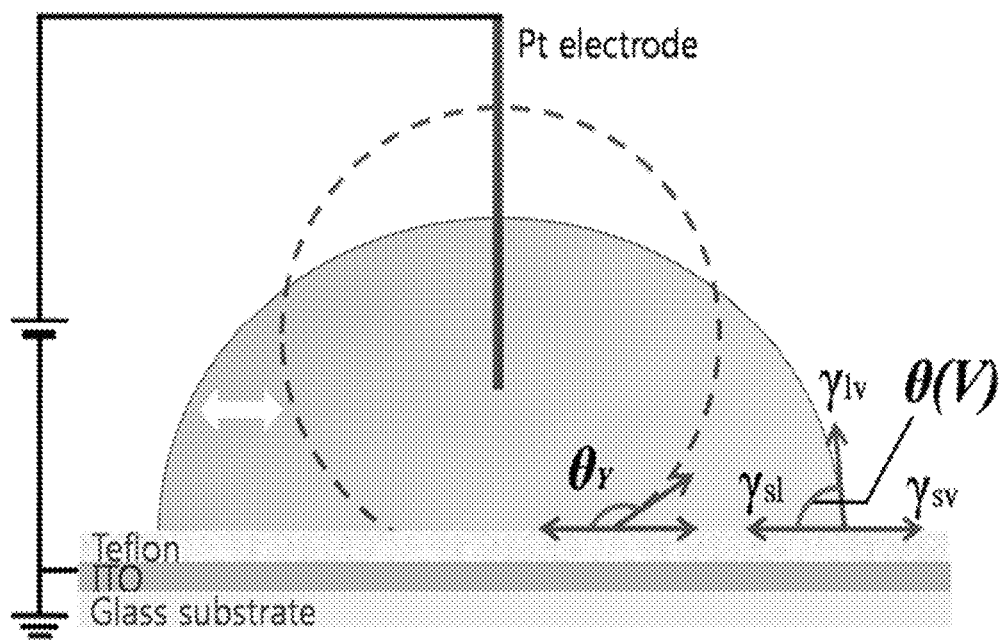
FIG. 1A is a schematic diagram illustrating a principle of electrowetting. θ (V) represents the contact angle at a voltage of V.
Figure 1B:
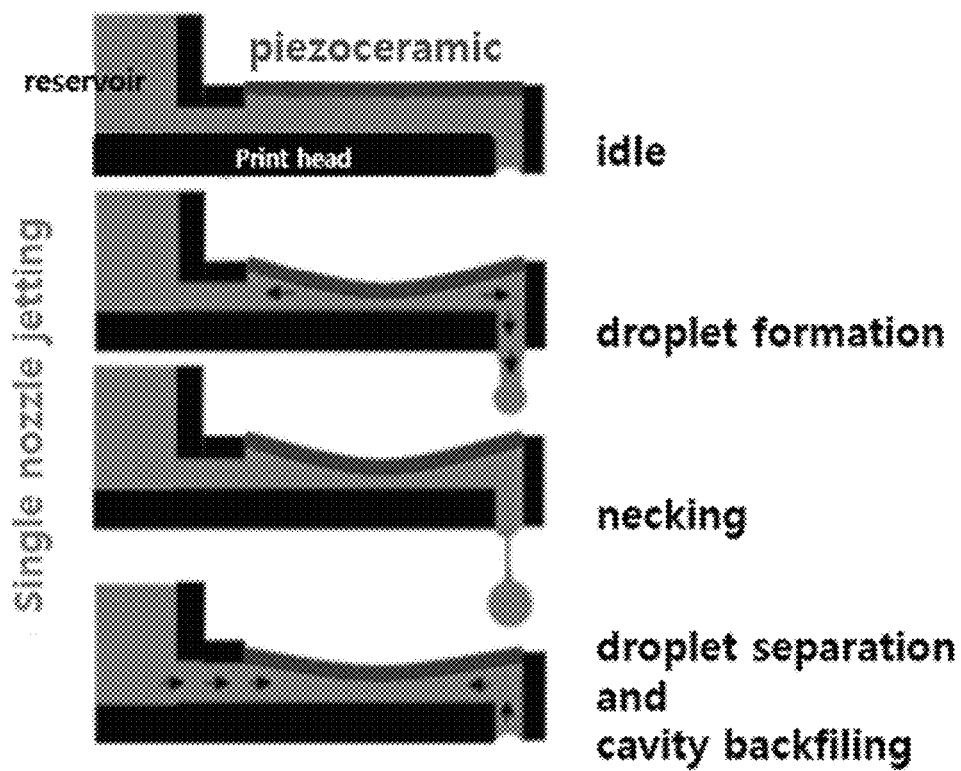
FIG. 1B is a schematic diagram illustrating a principle of an inkjet printer used in the present invention. Unlike the conventional method using a patterning apparatus, a printing manner using a piezo electric head is shown, and according to this manner, desired patterns can be simply formed by jetting a carbon nanotube (CNT) ink on paper.

The present inventors have endeavored to develop an inexpensive, economical, and practical microfluidic chip that can be manufactured by a simple method. As a result, the present inventors have developed a module type microfluidic paper chip manufactured by printing various shapes of electrode patterns using a CNT ink and inkjet printing, and then cutting and assembling the electrode patterns. The microfluidic paper chip of the present invention is an assembly type paper chip in which various shapes of electrode patterns are printed on a single sheet of paper, and unnecessary patterns are cut, and the uncut patterns are connected. The microfluidic paper chip of the present invention requires merely a convenient printing procedure using an inkjet printer including personal desktop printers used commonly in home, unlike the conventional printed circuit board manufacturing method using a patterning agent or a patterning apparatus. Thus, the patterning method can be simplified, and various kinds of chips can be manufactured depending on the assembly type of the electrode patterns, thereby obtaining excellent economic feasibility and utilizability.

Through electrowetting, the movement of water droplets can be controlled by electricity, and the electrowetting is employed in the digital microfluidic chip. Here, necessary electrodes are easily printed on paper using an inkjet printer and a conductive ink, and then various shapes of chips are manufactured by assembling the electrodes, which is the core of the present invention. In order to manufacture the digital microfluidic chip, the forming of various shapes of electrode patterns is important, and a complicated process such as photolithography is generally required. However, in the present invention, several shapes of patterns can be printed on paper at a time by an inkjet printer using a CNT ink among several kinds of conductive inks. In addition, a chip with a desired shape can be easily manufactured by cutting only necessary patterns from the output patterns.

Hereinafter, a method for manufacturing a module type microfluidic chip of the present invention will be specifically described.

Step (a): Printing Electrode Patterns

First, electrode patterns are printed on a substrate using a conductive ink and inkjet printer.

The inkjet printer used herein refers to a printer using a piezo electric head in printer apparatuses, which are the representative output devices of a computer, and forms characters by jetting an ink on the paper. That is, the inkjet printing is a printer in which a character is printed by impulse the ink jetted out through the nozzle as a drop to which a pulsed-voltage controlled according to the shape and position of the character is applied, and hitting the ink particles on a surface of the paper to allow the ink particles to adhere to the surface of the paper. The ink is first injected into the ink head, and jetted in a shape of the character by operating a crystal oscillator. The jetted ink hits to adhere to the surface of the paper, thereby expressing a dot matrix type character shape. The electrode patterns include electrodes having a distance of 0.1 mm-0.7 mm.

As used herein, the term "conductive ink" refers to a ink comprising powder or conductive materials such as silver and carbon pieces, or comprising materials to be drawn or printed on various solid substrates such as papers or films. The conductive ink includes a metallic ink (for example, gold, silver, copper, nickel, platinum and palladium), a ceramic ink (for example, a metallic oxide and carbon materials such as carbon nanotubes), and a molecular ink (for example, special organic matters and high molecular materials), but are not limited thereto.

The conductive ink usable in the method of the present invention is required to have a predetermined level of conductivity in order to be used as an electrode, and preferably, the conductive ink contains CNTs. The carbon nanotube has more excellent electrical features than a metal material having relatively excellent electric conductivity or resistivity, such as aluminum or cupper. Therefore, when this carbon nanotube is used as a conductive material, electric resistance can be reduced and thermal conductivity is also excellent, thereby effectively releasing the heat inside the printed circuit board to the outside.

Examples of the carbon nanotube include a single wall carbon nanotube, a double-wall carbon nanotube, a multi-wall carbon nanotube, and a bundle type carbon nanotube, and preferably, the carbon nanotube is a multi-wall carbon nanotube. An electrode made of the multi-wall carbon nanotube exhibits 1 k$\Omega$/sq on general A4 paper and 200 $\Omega$/sq on photograph printing paper.

The conductive ink may be manufactured to include suitable solvents, conductive materials, adhesive improvers, reducing agents or coupling agents. The solvents include glycidic ethers, glycol ethers, plant oils, alpha-terpineols or NMP (N-methyl-2-pyrrolidone), but are not limited thereto. The adhesive improvers include acrylic or vinyl resins, which the vinyl resins may be a mixture comprising additional silane compounds. The reducing agents prevent from decreasing the electric conductivity by reduction reaction of conductive material. For instance, The reducing agents include hydrazine-based reducing agents or aldehyde-based reducing agents. The hydrazine-based reducing agents include hydrazine, hydrazine hydrate, hydrazine sulfate, hydrazine carbonate and hydrazine hydrochloride. The aldehyde-based reducing agents include formaldehyde, acetaldehyde and propionaldehyde, but are not limited thereto.

According to a specific embodiment of the present invention, in order to print various CNT electrode patterns using an inkjet printer, a dispersant is put in the multi-wall CNTs, followed by ball milling, thereby preparing a CNT ink uniformly dispersed in water. A drawing for electrode patterns is made using a program such as Photoshop or CAD; electrodes with desired shapes are printed on general A4 paper or photograph printing paper; the printed electrode patterns are cut using a cutting tool; and the patterns are assembled in various shapes, thereby performing patterning in a desired shape.

As used herein, the term "electrode pattern" refers to one unit shape that constitutes a route through which fluid can move when a voltage is applied thereto, and the electrode pattern may be formed in various shapes.

According to a specific embodiment of the present invention, in order to manufacture a digital microfluidic paper chip, the electrode patterns may be formed in various shapes, for example: (i) a shape of a start point at which a water droplet is first made (dispensing); (ii) a shape in which water droplets linearly move on linearly arranged electrodes (linear transport); (iii) a shape in which several droplets meet and merge (merging); (iv) a shape in which the merged droplets mix due to the movement thereof (mixing); or (v) a shape in which several droplets meet and merge or cross each other (crossing), but the shapes of the electrode patterns are limited thereto.

Herein, one of the characteristics of the microfluidic paper chip of the present invention is to easily obtain various electronic patterns using an easy-to-handle and easy-to-cut solid phase substrate. Various solid substrates used in the art may be used as the substrate. For example, the substrate may include easy-to-handle paper (e.g., general A4 paper or photograph printing paper), film (e.g., OHP film), and a plastic sheet, and the substrate is preferably paper or film, and more preferably paper.

Step (b): Cutting Printed Electrode Patterns

Then, the electrode patterns printed in step (a) are cut using an appropriate tool.

According to a specific embodiment of the present invention, since the electrode patterns are printed on the paper, the electrode patterns may be easily cut using various cutting tools known in the art, such as scissors and cutters. The electrode patterns printed on the OHP film may be also cut using scissors.

Step (c): Assembling Electrode Patterns

The cut electrode patterns are assembled to pattern a circuit of a module type microfluidic paper chip.

As used herein, the term "patterning" refers to configuring a circuit with a desired form using the cut electrode patterns.

According to a preferable embodiment of the present invention, the method may further include, after step (c), depositing an insulator so as to form an insulating layer on the electrode patterns.

The insulator is glass, porcelain or polymer composition, preferably, the insulator is a polymer composition. The polymer composition may include parylene, such as parylene N, parylene C, parylene D and parylene F, preferably, the polymer composition includes parylene C.

According to another preferable embodiment of the present invention, the method may further include, after step (c), coating a reinforcing material on the electrode patterns. The coating layer may be formed on at least partial regions of surfaces of a plurality of chips through spin coating, spray coating, or printing. Alternately, the coating layer may be formed on at least partial regions of the surfaces of the plurality of chips through physical vapor deposition, chemical vapor deposition, or electroplating.

The reinforcing material serves to withhold heat, pressure, and the like, in the procedure of using the microfluidic paper chip of the present invention, and various materials known in the art may be used. Preferably, the reinforcing material is polytetrafluoroethylene.

The method for manufacturing the module type microfluidic paper chip of the present invention may further include a step of, before step (a), determining electrode patterns to be printed by using (i) an inversely proportional relationship between a moving distance ($\Delta x$) of fluid dropped inside the chip and an electrode distance (d); and (ii) a proportional relationship between the moving distance ($\Delta x$) of the fluid and the level of a voltage applied to the chip. Thus, the circuit patterns can be manufactured by finding out the optimum conditions under which the fluid can move along the electrodes.

According to a specific embodiment of the present invention, in the case where the water droplet is dropped on the microfluidic paper chip of the present invention, and then the movement distance of the water droplet is measured at voltages of 70 V and 120 V while the electrode distances are different for each voltage, the electrode distance (d) and the moving distance ($\Delta x$) of the fluid have an inversely proportional relationship, and the voltage level (V) and the moving distance ($\Delta x$) of the fluid have a proportional relationship.

Figure 3:
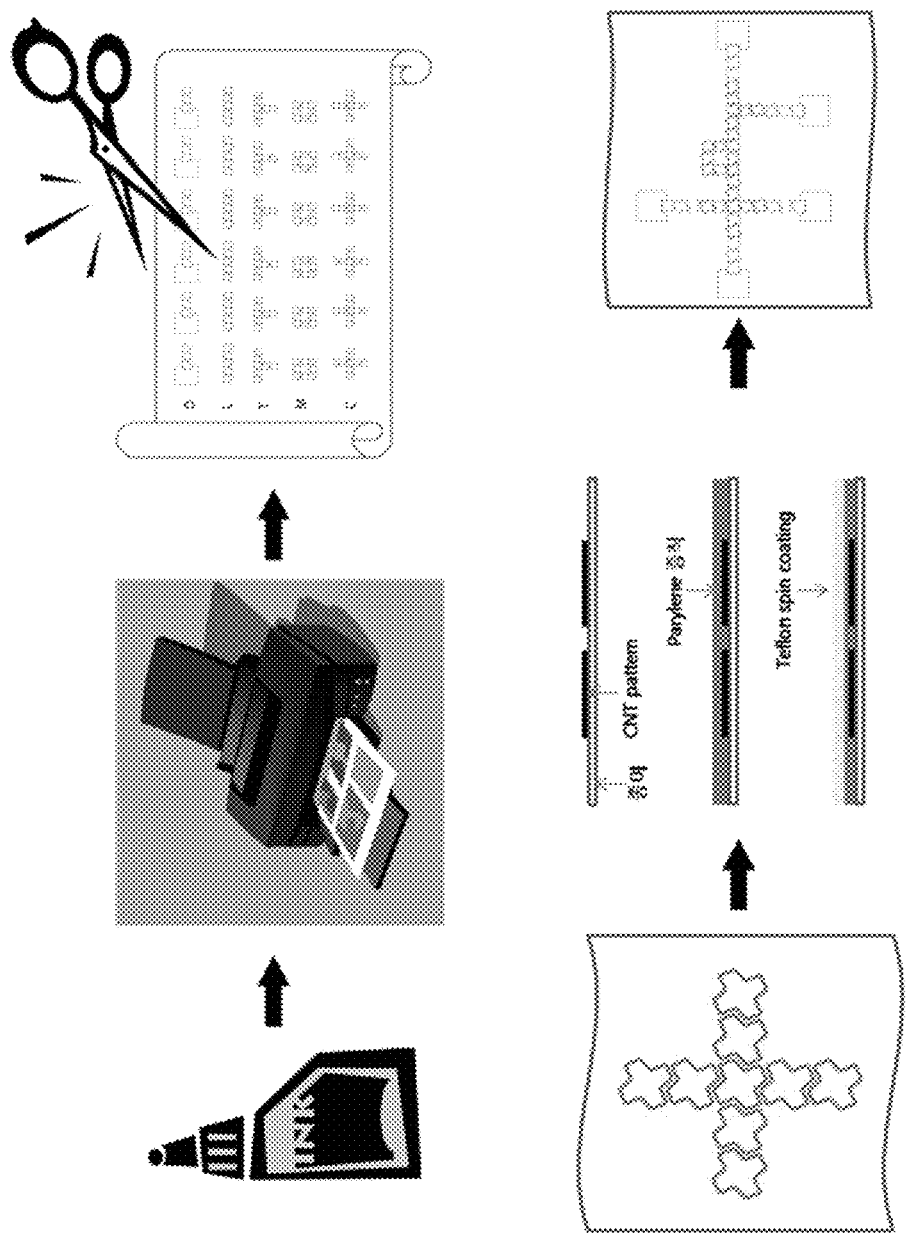
FIG. 3 is a schematic diagram illustrating a procedure for manufacturing a module type microfluidic paper chip using an inkjet printer.

The method of the present invention as described above is expressed by performing the steps of: (a) printing electrode patterns; (b) cutting electrode patterns; and (c) assembling electrode patterns. However, in order to manufacture the microfluidic paper chip more quickly, when the drawing of the electrode patterns is made in step (a), the electrode patterns may be printed in a form in which the assembling or the patterning is completed. In the following examples, the method for manufacturing a module type microfluidic paper chip will be set forth in detail, and the schematic method is shown in the present specification and FIG. 3.

According to another aspect of the present invention, the present invention provides a module type microfluidic paper chip manufactured by the method of the present invention.

Since the module type microfluidic paper chip of the present invention is manufactured by using the above-described method for manufacturing a module type microfluidic paper chip, descriptions of overlapping contents therebetween are omitted to avoid excessive complication of the specification due to repetitive descriptions thereof.

The module type microfluidic paper chip includes electrode patterns for receiving the fluid and allowing the flowing of the fluid. It can be confirmed that, when fluid is dropped on the electrode pattern of the module type microfluidic paper chip of the present invention and then a voltage is applied thereto, the movement of water droplet can be controlled on the surface of the chip as shown in FIG. 4. Therefore, the module type microfluidic paper chip of the present invention can be utilized in several steps of chemical synthesis by using various uniform electrode patterns. According to a specific embodiment, the module type microfluidic paper chip of the present invention can be used as a use for synthesizing nanoparticles.

Features and advantages of the present invention are summarized as follows:

(a) The present invention relates to an assembly type paper chip in which electrode patterns with various shapes are printed on a single sheet of paper at a time and necessary patterns are be cut and stuck together.

(b) The method of the present invention merely employ a convenient printing procedure using an inkjet printer, unlike conventional method for manufacturing a printed circuit board using a patterning agent or a patterning apparatus, and thus the patterning method can be simplified and various kinds of chips can be manufactured according to the assembly type of the electrode patterns.

(c) Thus, an inexpensive, economical, and highly utilizable microfluidic paper chip can be provided by using the method of the present invention.

Hereinafter, the present invention will be described in detail with reference to examples. These examples are only for illustrating the present invention more specifically, and it will be apparent to those skilled in the art that the scope of the present invention is not limited by these examples.

EXAMPLES

Example 1

Preparing Carbon Nanotube (CNT) Ink

Figure 2A:
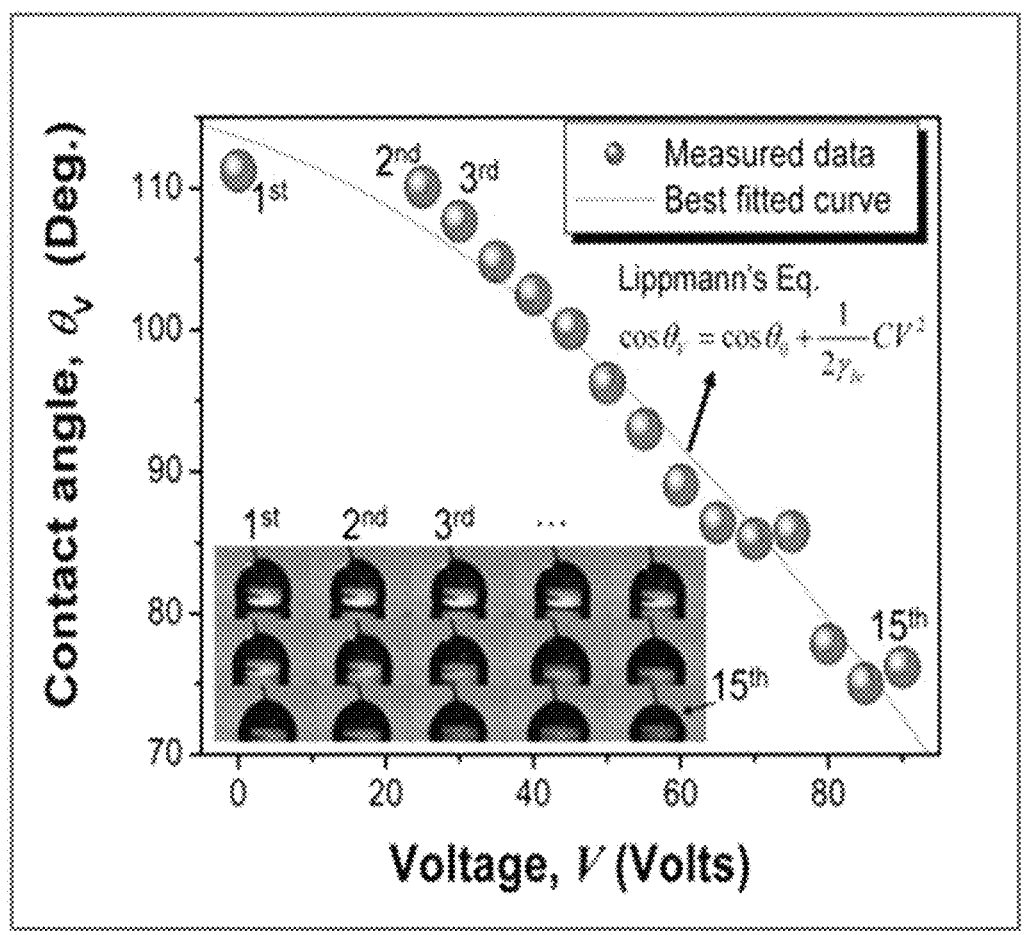
FIG. 2A shows contact angle measured results on the paper chip using a CNT ink.
Figure 2B:
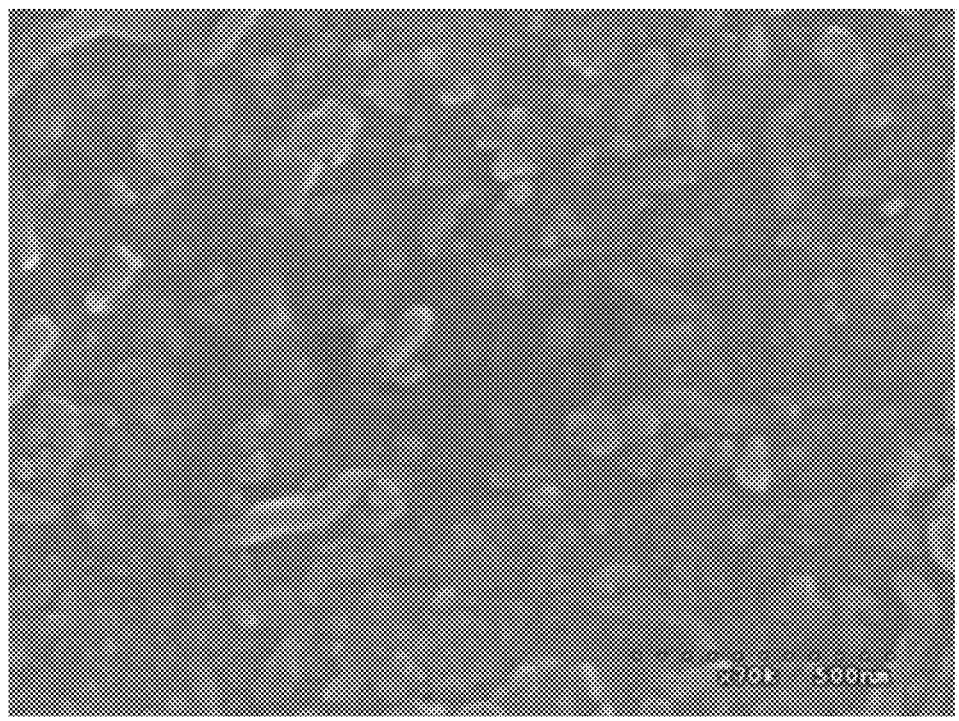
FIG. 2B shows an image obtained by observing a surface of a printed electrode through an electron scanning microscope, the printed electrode being formed by preparing a CNT ink uniformly dispersed in water so as to print the electrode and then printing the CNT ink using an inkjet printer (magnification: ×70,000).

In order to print electrode patterns, an ink was prepared using CNTs, and the ink was printed on paper and then used as an electrode. In order to print the CNT electrodes using an inkjet printer, first, a dispersant was put in multi-wall CNTs, followed by ball milling, thereby preparing a CNT ink dispersed in water. The electrode was printed by an inkjet printer using the ink, and then a surface of the printed electrode was observed by an electron scanning microscope. The results showed that the CNT ink prepared in the present invention uniformly packs the paper (FIG. 2B).

Meanwhile, the electrode is required to have a predetermined level of conductivity to perform a function thereof. In the present invention, the CNT electrode had 1 k$\Omega$/sq on a general A4 paper and 200 $\Omega$/sq on a photograph printing paper, and thus exhibited conductivity sufficient to be used as an electrode.

Example 2

Producing DLTMC Patterns of Digital Microfluidic Paper Chip Using Carbon Nanotube (CNT) Ink In order to produce an electrode pattern to be used in manufacturing a digital microfluidic paper chip, the drawing was made using a program, such as Photoshop or CAD, and an electrode with a desired shape was printed on general A4 paper or photograph printing paper at a resolution of several tens of μm by using the CNT ink and an inkjet printer.

Figure 4A:
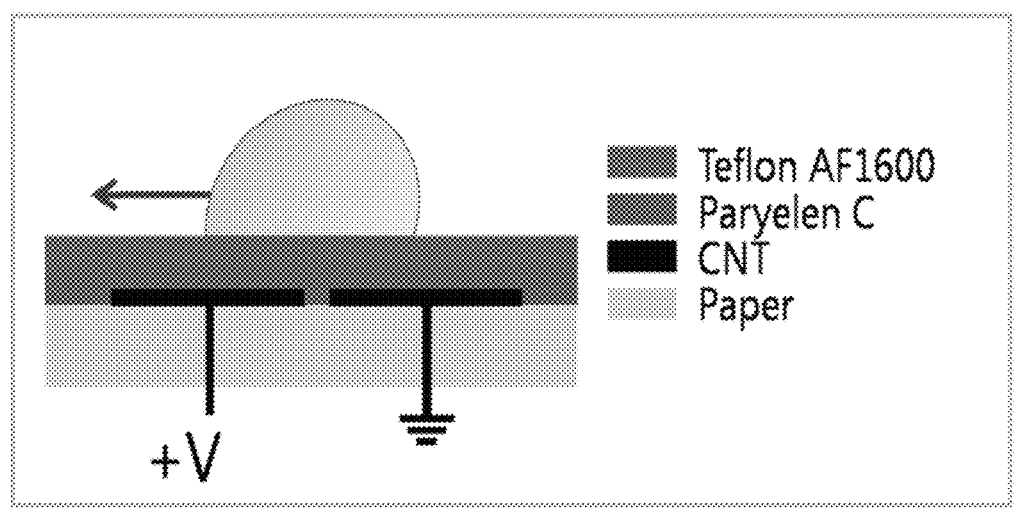
FIG. 4A is a schematic diagram illustrating the movement of a water droplet on arranged electrodes.
Figure 4B:
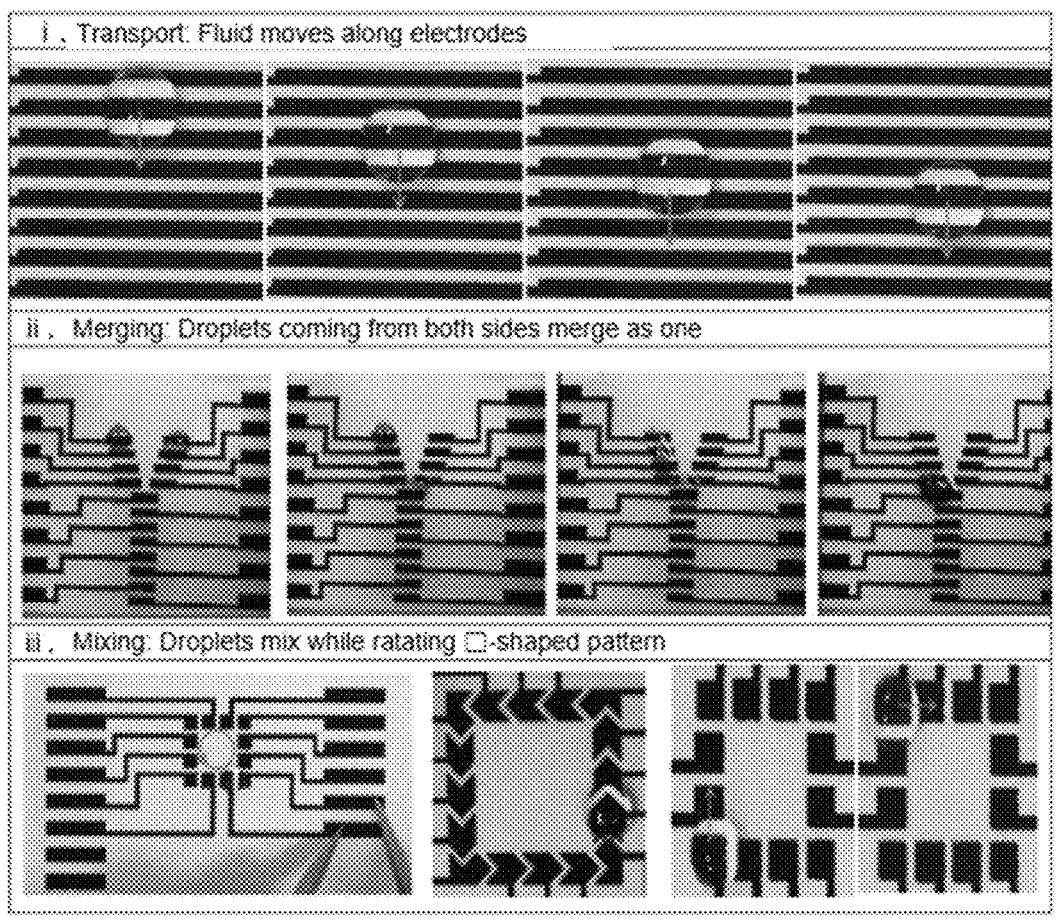
FIG. 4B shows the driving behavior of an actually manufactured microfluidic paper chip of the present invention.

After that, necessary electrode patterns were cut from the printed paper, followed by patterning, and in order to form an insulating layer thereon, parylene C was deposited and Teflon AF1600 was spin-coated. In the case where a water droplet was dropped on the electrode patterns of the paper chip, on which the parylene C and Teflon were deposited, and then a voltage (V) was applied thereto, it was confirmed that the movement of the water droplet on a surface of the chip can be controlled as shown in FIG. 4A. FIG. 4B shows the driving behavior of an actually manufactured microfluidic paper chip of the present invention. The fluid movements (transport, merging, and mixing) on the chip were exemplified, and the arrows represent the moving directions of the fluid.

Figure 9:
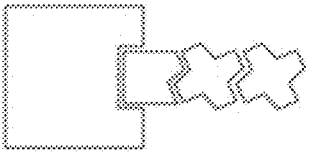
FIG. 9 shows five kinds of electrode patterns (D, L, T, M, and C).

Meanwhile, in order to manufacture a digital microfluidic paper chip, it should be possible for water droplets to be move, such as a movement as a start point at which a water droplet is first made (dispensing), a movement in which water droplets linearly move on linearly arranged electrodes (linear transport), a movement in which several droplets meet and merge (merging), a movement in which the merged droplets mix due to the movement thereof (mixing), and the like. Thus, in the present invention, a total of five kinds of electrode patterns were printed on a single sheet of paper, and then DLTMC patterns shown in Table 1 and FIG. 9 were produced.

TABLE 1

| Pattern name | DLTMC pattern Usage |
|---|---|
| D | Dispensing: A start point at which a solution necessary for a reaction first comes out as a droplet |
| L | Linear transport: A path on which water droplets (or solution) linearly move along electrodes |
| T | Merging: A T-shaped site at which droplets coming from both sides merge as one |
| M | Mixing: A site at which droplets mix inside while rotating along electrodes arranged in a square shape |
| C | Cross: A site at which several droplets meet and merge or several moving directions of the droplets are made. |

Example 3

Figure 5:
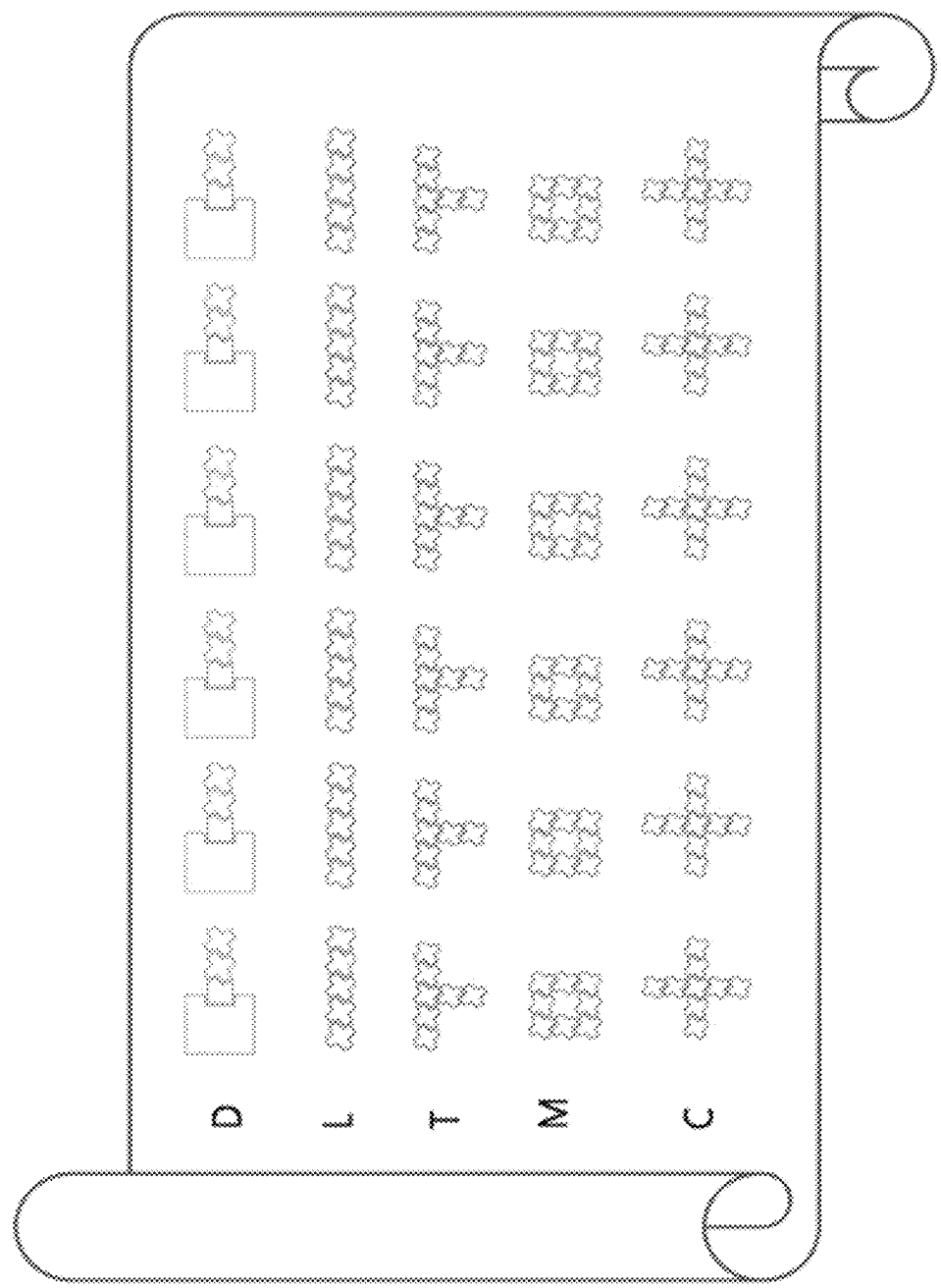
FIG. 5 is a schematic diagram showing five kinds of electrode patterns used in manufacturing the paper chip of the present invention.
Figure 6:
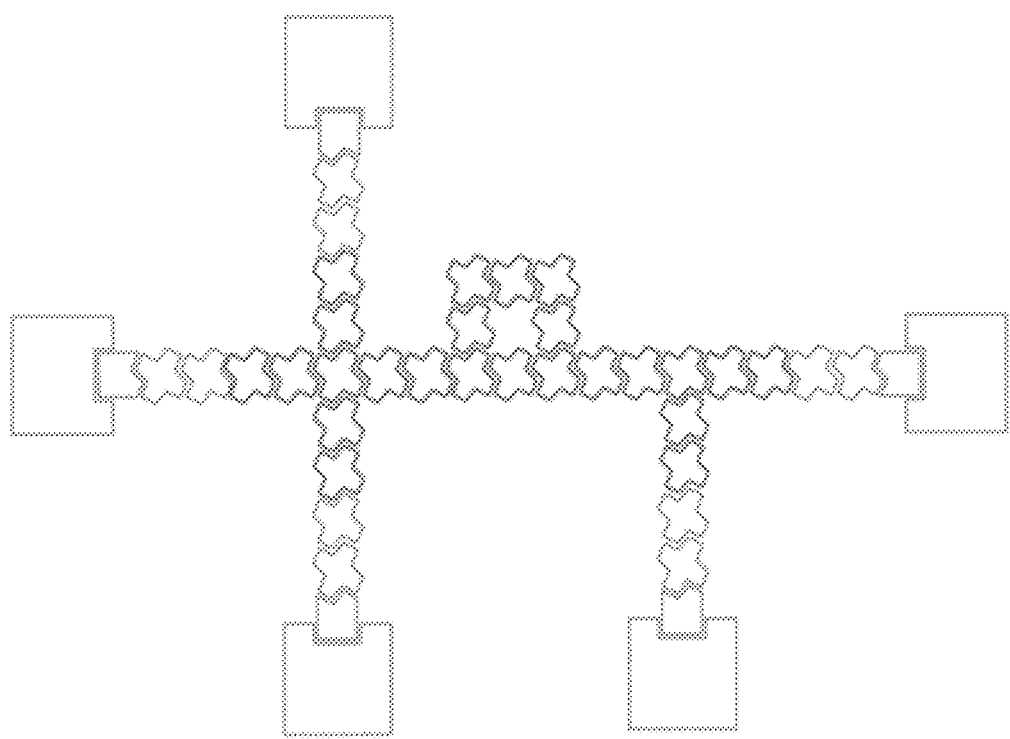
FIG. 6 shows an assembling example of a CMT chip.
Figure 10:
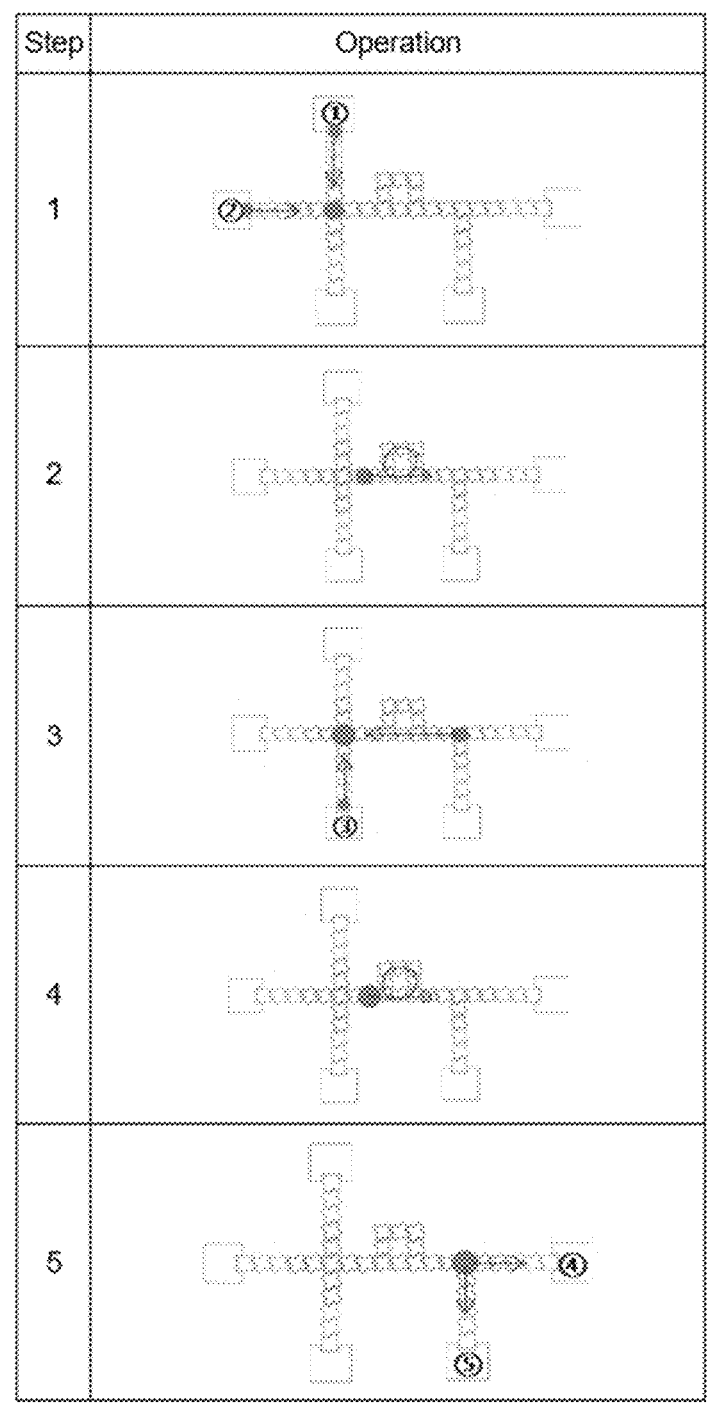

Module Chip Combined with CMT Patterns and Synthesis of Gold Nanoparticles Using Same A module chip combined with CMT patterns was assembled by using five D patterns and one of each for C, M, and T patterns. Gold nanoparticles were synthesized by using the patterns and three kinds of solutions (HAuCl4, NaBH4, and lysine). FIG. 5 shows an assembly example of a module chip combined with CMT patterns, and Table 2 and FIG. 10 show an operation and a gold nanoparticle synthesis step at each site along the moving route of fluid on a module chip combined with CMT patterns.

TABLE 2

| Step | Synthesis of gold nanoparticles Description |
|---|---|
| 1 | A HAuCl$_4$ solution from ① and a NaBH$_4$ solution from ② meet each other, and then merge at a +-shaped site. |
| 2 | The merged solutions mix with each other while rotating along a □-shaped pattern (colloidal gold nanoparticles are formed). |
| 3 | A lysine solution as a capping reagent comes out from ③, and then meets the solutions of step 2. |
| 4 | Droplets made in step 3 mix with each other while rotating □-shaped pattern. |
| 5 | A solution of capped gold nanoparticles moves to ④, and then detected by interworking with another apparatus. Unnecessary byproducts move to ⑤. |

Example 4

Measuring Relationship Between Electrode Distance and Moving Distance

Figure 7:
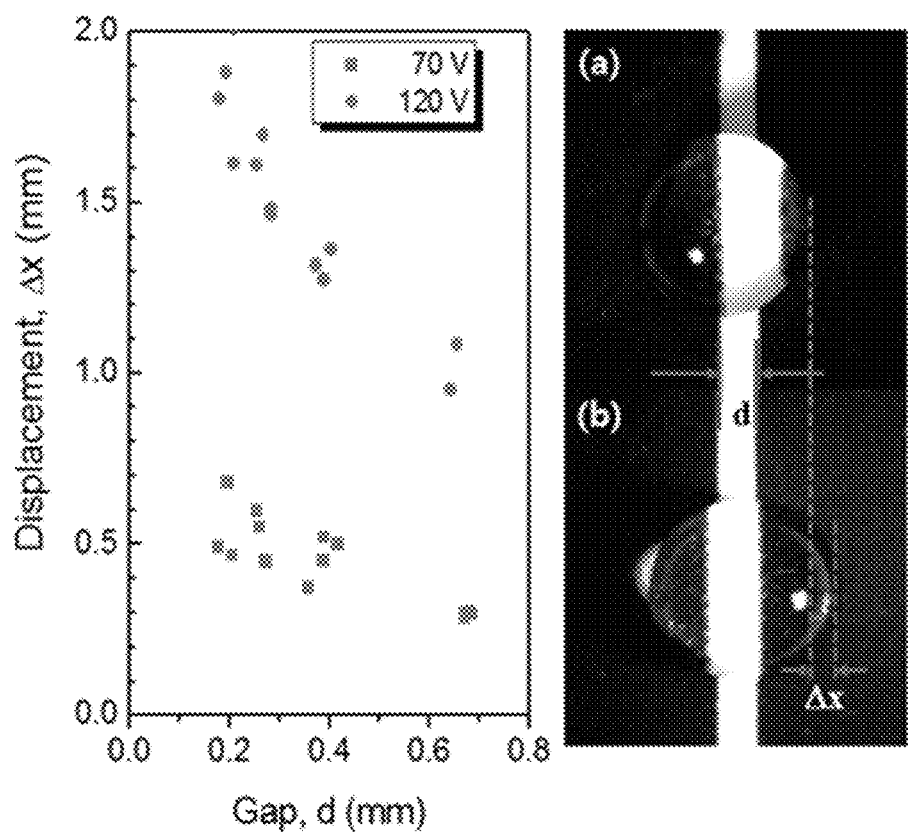
FIG. 7 shows a graph showing a relationship between a distance between electrodes (d) and a moving distance of fluid (Δx). The fluid was moved from right to left.

Water droplets were dropped inside the chip, and then the moving distance was measured under predetermined levels of voltages (70 V and 120 V) while the electrode distances are different for each voltage level. In FIG. 7, the black bands represent electrodes and the white band represents paper. As can be seen from FIG. 7, the moving distance of the fluid varies depending on the electrode distance even at the application of the same voltage, and the higher the applied voltage, the larger the moving distance of the fluid. That is, the results showed that the moving distance and the electrode distance have a relationship for each voltage. It was confirmed that the electrode distance and the moving distance of the fluid have an inversely proportional relationship, and the voltage level and the moving distance of the fluid have a proportional relationship.

Meanwhile, in the inkjet printer used in the present invention, the electrode distance is limited to the minimum 0.1 mm-0.2 mm, and the maximum electrode distance for enabling the driving of a circuit is 0.7 mm. Therefore, when a microfluidic paper chip is manufactured, circuit patterns can be manufactured by finding out the optimum conditions under which the fluid can move along electrodes in consideration of the relationship between the electrode distance and the moving distance.

Figure 8:
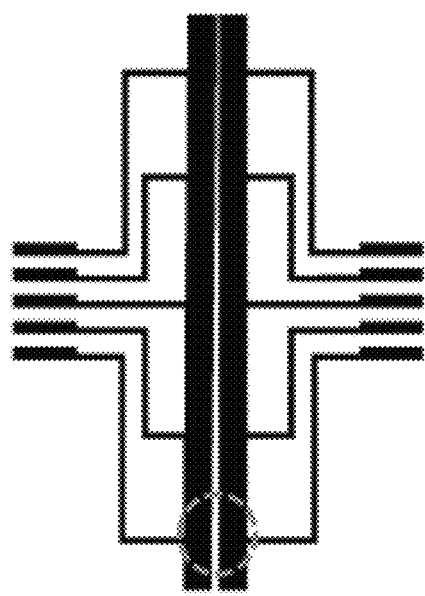
FIG. 8 shows a chip used in an electrode distance-moving distance test. A portion of an electrode on which fluid moves was circled.

FIG. 8 shows a microfluidic paper chip used in the electrode distance-moving distance test, and the test was conducted between both electrodes shown in FIG. 8. The water droplet moves through electrodes and routes in a vertical direction. The difference in the moving distance of the water droplet between the electrode and the electrode was designated by "Δx", and the electrode distance was designated by "d".

Although the present invention has been described in detail with reference to the specific features, it will be apparent to those skilled in the art that this description is only for a preferred embodiment and does not limit the scope of the present invention. Thus, the substantial scope of the present invention will be defined by the appended claims and equivalents thereof.

The invention claimed is:

1. A method for manufacturing a module type microfluidic chip, the method comprising:
    (a') determining electrode patterns to be printed by keeping (i) an inversely proportional relationship between a moving distance (Δx) of a fluidic drop either over or on the chip and an electrode distance (d), and (ii) a proportional relationship between the moving distance (Δx) of the fluidic drop and the level of a voltage applied to the chip;
    (a) printing electrode patterns on a substrate using a conductive ink and inkjet printing;
    (b) cutting the printed electrode patterns; and
    (c) assembling the cut electrode patterns to manufacture the module type microfluidic chip.

2. The method of claim 1, wherein the conductive ink is a metallic ink, a ceramic ink, or a conducting molecular ink.

3. The method of claim 2, wherein the ceramic ink is a carbon nanotube (CNT) ink.

4. The method of claim 1, further comprising: after step (c), depositing an insulator on the electrode patterns to form an insulating layer.

5. The method of claim 4, wherein the insulator is glass, porcelain, or a polymer composition.

6. The method of claim 5, wherein the polymer composition is parylene.

7. The method of claim 1, further comprising: after step (c), coating a reinforcing material on the electrode patterns.

8. The method of claim 7, wherein the reinforcing material is polytetrafluoroethylene.

9. The method of claim 1, wherein the substrate is paper or film.

10. The method of claim 1, wherein the electrode patterns include electrodes and a distance between electrodes is 0.1 mm-0.7 mm.

11. A module type microfluidic chip manufactured by the method of claim 1.

* * * * *